(12) United States Patent
Kim et al.

(10) Patent No.: US 7,932,970 B2
(45) Date of Patent: Apr. 26, 2011

(54) TWO DIMENSIONAL LIGHT SOURCE USING LIGHT EMITTING DIODE AND LIQUID CRYSTAL DISPLAY DEVICE USING THE TWO DIMENSIONAL LIGHT SOURCE

(75) Inventors: Gi-Cherl Kim, Yongin-si (KR); Se-Ki Park, Suwon-si (KR); Ju-Young Yoon, Suwon-si (KR); Byung-Choon Yang, Seongnam-si (KR); Seok-Hyun Nam, Seoul (KR); Sang-Yu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 12/206,956

(22) Filed: Sep. 9, 2008

(65) Prior Publication Data

US 2009/0001400 A1 Jan. 1, 2009

Related U.S. Application Data

(62) Division of application No. 11/158,644, filed on Jun. 22, 2005, now Pat. No. 7,436,000.

(30) Foreign Application Priority Data

Jan. 26, 2005 (KR) .......................... 10-2005-0007126

(51) Int. Cl.
  *G02F 1/1335* (2006.01)
(52) U.S. Cl. ........................................................ 349/69
(58) Field of Classification Search ...................... 349/69
  See application file for complete search history.

(56) References Cited

U.S. PATENT DOCUMENTS

| | | | |
|---|---|---|---|
| 2002/0001192 A1 | 1/2002 | Suehiro et al. | |
| 2003/0058650 A1 | 3/2003 | Shih | |
| 2003/0137621 A1* | 7/2003 | Zhang et al. ................ | 349/106 |
| 2003/0178627 A1 | 9/2003 | Marchl et al. | |
| 2004/0262623 A1 | 12/2004 | You | |
| 2005/0174544 A1 | 8/2005 | Mazzochette | |

FOREIGN PATENT DOCUMENTS

| | | |
|---|---|---|
| CN | 1436374 | 8/2003 |
| JP | 11162232 | 6/1999 |
| JP | 2000156525 | 6/2000 |
| JP | 2000236116 | 8/2000 |
| JP | 2001044512 | 2/2001 |
| JP | 2001326389 | 11/2001 |
| JP | 2002033011 | 1/2002 |
| JP | 2002040955 | 2/2002 |
| JP | 2003124524 | 4/2003 |
| JP | 2004039691 | 2/2004 |
| JP | 2004200239 | 7/2004 |
| JP | 2004241509 | 8/2004 |

(Continued)

*Primary Examiner* — Brian M. Healy
*Assistant Examiner* — Mary A El-Shammaa
(74) *Attorney, Agent, or Firm* — Cantor Colburn LLP

(57) ABSTRACT

A two-dimensional light source includes a base substrate having holes, wires disposed on a lower surface of the base substrate, a light emitting diode (LED) chip disposed on an upper surface of the base substrate, plugs that connect two electrodes of the LED chip to the wires through the holes, a buffer layer covering the LED chip, and an optical layer that is disposed on the buffer layer and has an optical pattern formed at a portion of the optical layer corresponding to the LED chip.

9 Claims, 11 Drawing Sheets

FOREIGN PATENT DOCUMENTS

| | | |
|---|---|---|
| KR | 20010114260 | 12/2001 |
| KR | 1020020035819 | 5/2002 |
| KR | 1020020073757 | 9/2002 |
| KR | 1020030067449 | 8/2003 |
| KR | 1020040019640 | 3/2004 |
| KR | 1020040057269 | 7/2004 |
| KR | 1020040081846 | 9/2004 |
| WO | 2004082036 | 9/2004 |

* cited by examiner

TWO DIMENSIONAL LIGHT SOURCE USING LIGHT EMITTING DIODE AND LIQUID CRYSTAL DISPLAY DEVICE USING THE TWO DIMENSIONAL LIGHT SOURCE

CROSS REFERENCE TO RELATED APPLICATIONS

This application is a divisional application of U.S. application Ser. No. 11/158,644, filed on Jun. 22, 2005, which claims priority to Korean Patent Application No. 2005-007126 filed in the Korean Intellectual Property Office on Jan. 26, 2005, and all the benefits accruing therefrom under 35 U.S.C §119, and the contents of which in its entirety are herein incorporated by reference.

BACKGROUND OF THE INVENTION (a) Field of the Invention

The present invention relates generally to a two-dimensional light source using light emitting diodes (LEDs), and more particularly to a surface light source used in backlighting a liquid crystal display (LCD) device and an LCD device using the same.

(b) Description of the Related Art

Display devices used to display images, such as television receivers and computer monitors, are classified into self-luminescence display devices capable of self-emitting and light receiving display devices requiring a separate light source. Light emitting diodes (LEDs), electroluminescence (EL) devices, vacuum fluorescent display (VFD) devices, field emission display (FED) devices, plasma display panel (PDP) devices, etc., are included among self-luminescence display devices, while liquid crystal display (LCD) devices, etc., are included among light receiving display devices.

Generally, an LCD device includes two panels that each have field generating electrodes on their inner surfaces, and a dielectric anisotropy liquid crystal layer interposed between the two panels. In the LCD device, a variation of a voltage difference between the field generating electrodes, i.e., a variation in strength of an electric field generated by the field generating electrodes, changes the transmittance of light passing through the LCD device, and thus images are obtained by controlling the voltage difference between the field generating electrodes. In the LCD device, light may be either natural light or artificial light emitted by a light source separately employed in the LCD device.

A backlight is a representative device for providing artificial light to the LCD device and utilizes light emitting diodes (LEDs) or fluorescent lamps, such as cold cathode fluorescent lamps (CCFLs), external electrode fluorescent lamps (EEFLs), etc., as the light source.

LEDs have eco-friendly characteristics since they do not use mercury (Hg), and a working lifetime of the LEDs is longer than working lifetimes of most other light sources due to stable characteristics of the LEDs. For these reasons, LEDs are especially popular for use as next-generation light sources.

However, light emitted from the LEDs tends to be condensed to a substantially narrow area. Accordingly, for applying the LEDs to a surface light source (two-dimensional light source), various optical films capable of distributing light to a wider region are required. Additionally, a space for allowing light dispersion within the LCD device is required. An assembly process of such optical films makes a fabrication process of the LCD device more complex and the space required for allowing light dispersion may impede fabrication of a thinner device.

SUMMARY OF THE INVENTION

An objective of the present invention is to make a light source using light emitting diodes (LEDs) slimmer. Another objective of the present invention is to simplify an assembly process of a backlight for an LCD device.

To achieve the objectives, according to an aspect of the present invention, there is provided a two-dimensional light source comprising a base substrate, a wire member, a light emitting diode (LED) chip, a plug member, a buffer layer, and an optical layer. The base substrate has a lower surface and an upper surface and a hole. The hole penetrates the base substrate. The wire member is disposed on a lower surface of the base substrate. The LED chip is disposed on the upper surface of the base substrate and has an electrode member. The plug member is disposed in the hole and connects the electrode member to the wire member through the hole. The buffer layer that covers the LED chip. The optical layer is disposed on the buffer layer and includes a pattern member disposed at a portion of the optical layer corresponding to the LED chip.

According to another aspect of the present invention, there is provided a two-dimensional light source comprising two-dimensional light source modules arranged substantially in a matrix. Each light source module includes a base substrate having holes, wires disposed on a lower surface of the base substrate, a light emitting diode (LED) chip disposed on an upper surface of the base substrate, plugs that connect electrodes of the LED chip to the wires through the holes, a buffer layer that covers the LED chip, and an optical layer disposed on the buffer layer and including an optical pattern formed at a portion of the optical layer corresponding to the LED chip.

According to still another aspect of the present invention, there is provided a liquid crystal display (LCD) device comprising a two-dimensional light source and a liquid crystal panel assembly that is disposed proximate to the two-dimensional light source and includes two panels and a liquid crystal layer interposed between the two panels. In this structure, the two-dimensional light source includes a printed circuit board (PCB) substrate having holes passing from a lower surface to an upper surface of the PCB substrate, wires disposed on the lower surface of the PCB substrate, a heat radiating substrate that has holes passing from a lower surface to an upper surface of the heat radiating substrate and whose lower surface is attached to the upper surface of the PCB substrate, a light emitting diode (LED) chip disposed on the upper surface of the heat radiating substrate, plugs that connect electrodes of the LED chip to the wires through the holes of the PCB and heat radiating substrates, a buffer layer that covers the LED chip, and an optical layer disposed on the buffer layer and including an optical pattern formed at a portion of the optical layer corresponding to the LED chip.

This liquid crystal display device may further comprise two polarizers provided at both sides of the liquid crystal panel assembly.

This liquid crystal display device may further comprise an optical film provided between the two-dimensional light source and the liquid crystal panel assembly.

In this structure, an upper surface of the buffer layer may be planarized.

BRIEF DESCRIPTION OF THE DRAWINGS

The above and other objects or advantages of the present invention will become more apparent by describing exemplary embodiments thereof in greater detail with reference to the accompanying drawings, in which.

DETAILED DESCRIPTION OF THE INVENTION

Figure 1:
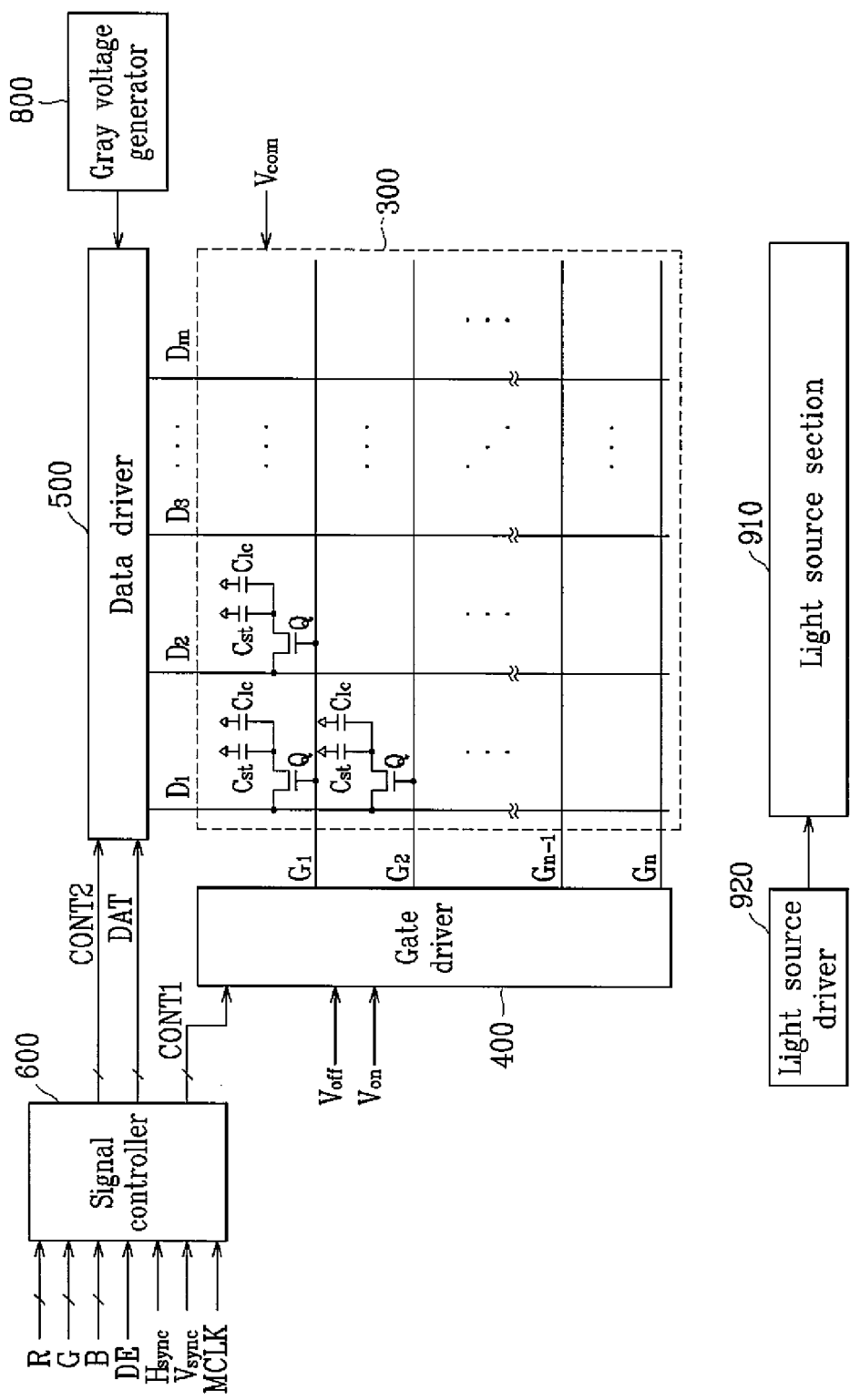
FIG. 1 is a block diagram of an LCD device according to an exemplary embodiment of the present invention.

Exemplary embodiments of the present invention will be described more fully hereinafter with reference to the accompanying drawings, in which exemplary embodiments of the invention are shown. The present invention may, however, be embodied in different forms and should not be construed as being limited to the embodiments set forth herein. Rather, these exemplary embodiments are provided so that this disclosure will be thorough and complete, and will fully convey the scope of the invention to those skilled in the art.

In the drawings, thickness and/or size of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Hereinafter, a driving system of a light source device for a display device according to exemplary embodiments of the present invention will be described in detail with reference to the accompanying drawings.

Figure 2:
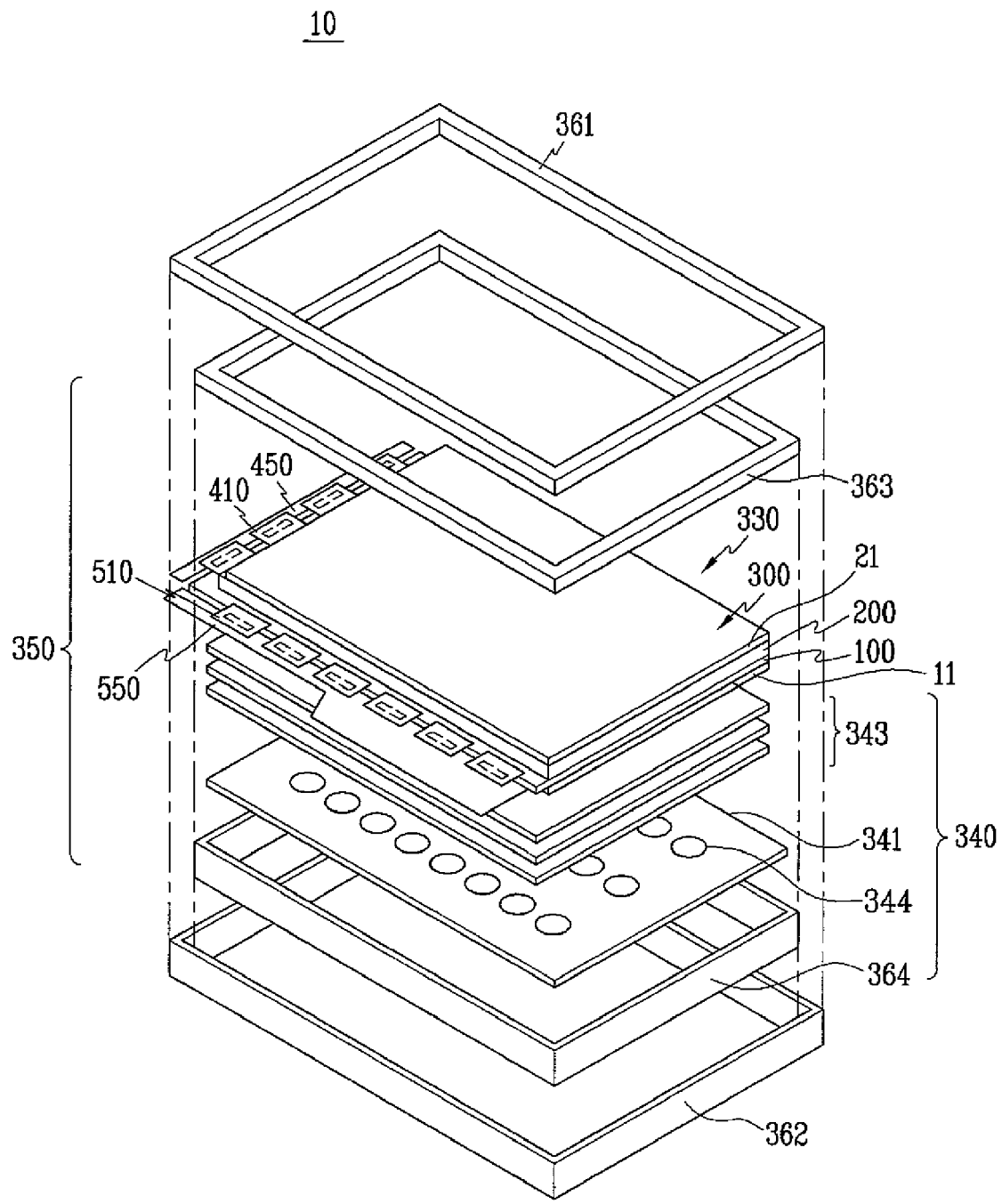
FIG. 2 is an exploded perspective view schematically illustrating an LCD device according to an exemplary embodiment of the present invention.
Figure 3:
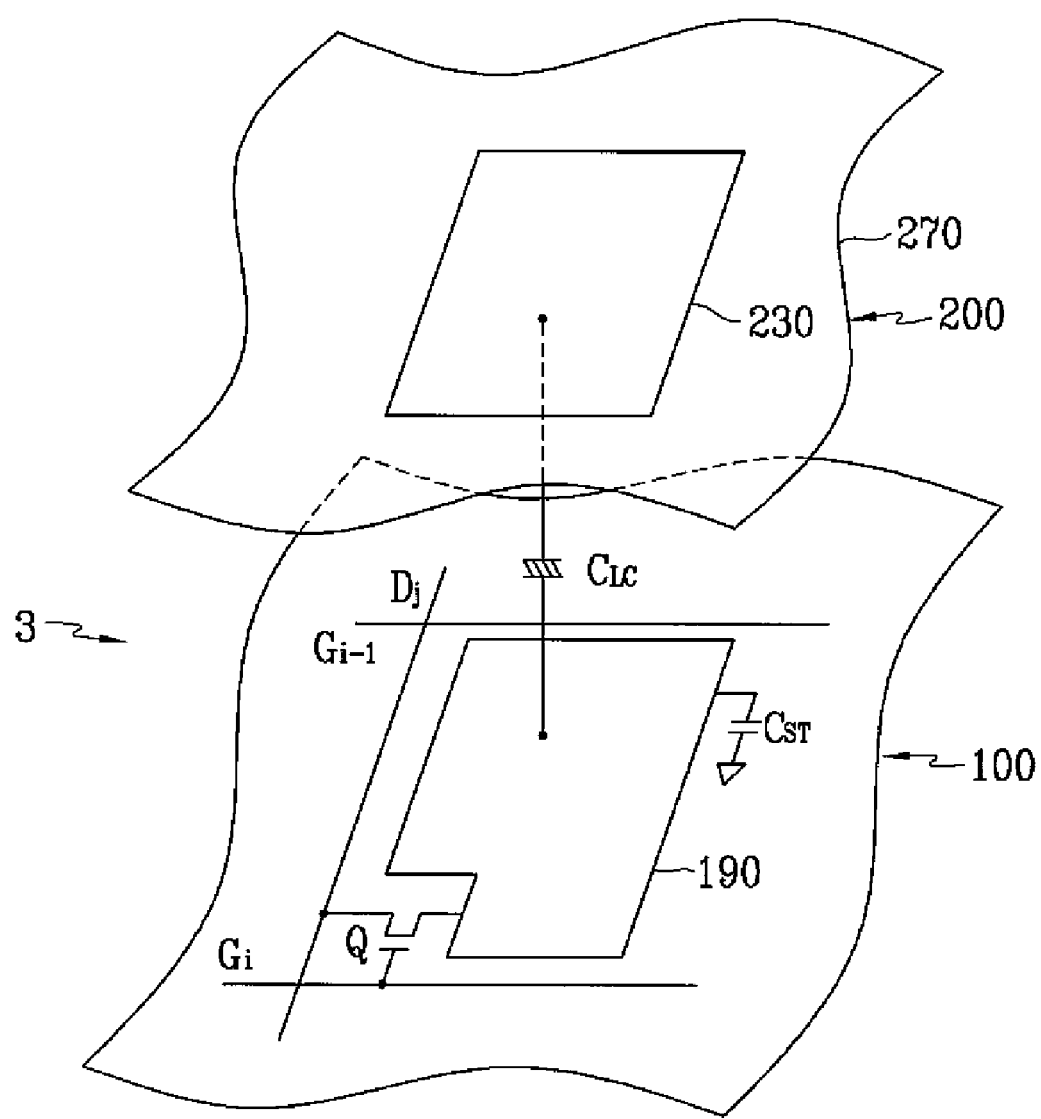
FIG. 3 is an equivalent circuit view of a pixel unit of an LCD device according to an exemplary embodiment of the present invention.

FIG. 1 is a block diagram of an LCD device according to an exemplary embodiment of the present invention. FIG. 2 is an exploded perspective view schematically illustrating an LCD device according to an exemplary embodiment of the present invention. FIG. 3 is an equivalent circuit view of a pixel unit of an LCD device according to an exemplary embodiment of the present invention.

Referring to FIG. 1, an LCD device comprises an LC panel assembly 300, a gate driver 400 and a data driver 500 that are each electrically connected to the LC panel assembly 300, a gray voltage generator 800 electrically connected to the data driver 400, a light source section 910 for supplying light to the LC panel assembly 300, a light source driver 920 for controlling the light source section 910, and a signal controller 600 for controlling the above elements.

Referring to FIG. 2, an LCD device 10 comprises an LC module 350 including a display unit 330 and a backlight 340, a front housing 361 and a rear housing 362 for receiving and supporting the LC module 350, and mold frames 363 and 364.

The display unit 330 includes the LC panel assembly 300, a gate tape carrier package (TCP) 410 and a data TCP 510 that are attached to the LC panel assembly 300, and a gate printed circuit board (PCB) 450 and a data PCB 550 that are individually attached to the gate and data TCPs 410 and 510, respectively.

In the structure shown in FIG. 2 and FIG. 3, the LC panel assembly 300 includes a lower panel 100 and an upper panel 200 facing each other, and an LC layer 3 interposed between the lower and upper panels 100 and 200. In the circuit shown in FIG. 1 and FIG. 3, the LC panel assembly 300 further includes display signal lines $G_1$-$G_n$ and $D_1$-$D_m$ and pixels that are connected the display signal lines $G_1$-$G_n$ and $D_1$-$D_m$ and arranged substantially in a matrix.

The display signal lines $G_1$-$G_n$ and $D_1$-$D_m$ are disposed on the lower panel 100 and include gate lines $G_1$-$G_n$ for transmitting gate signals (also referred to as "scanning signals"), and data lines $D_1$-$D_m$ for transmitting data signals. The gate lines $G_1$-$G_n$ extend substantially in a row direction and substantially parallel to each other, while the data lines $D_1$-$D_m$ extend substantially in a column direction and substantially parallel to each other. The row and column directions are substantially perpendicular to each other.

Each pixel includes a switching element Q that is electrically connected to corresponding ones of the display signal lines $G_1$-$G_n$ and $D_1$-$D_m$, and an LC capacitor $C_{LC}$ and a storage capacitor $C_{ST}$ that are electrically connected to the switching element Q. The storage capacitor $C_{ST}$ may be omitted.

The switching element Q, such as a thin film transistor (TFT), is provided on the lower panel 100 and has three terminals: a control terminal electrically connected to one of the gate lines $G_1$-$G_n$ (for example, $G_i$); an input terminal electrically connected to one of the data lines $D_1$-$D_m$ (for example, $D_j$); and an output terminal electrically connected to both the LC capacitor $C_{LC}$ and the storage capacitor $C_{ST}$.

The LC capacitor $C_{LC}$ includes a pixel electrode 190, provided on the lower panel 100, and a common electrode 270, provided on the upper panel 200, as two terminals. The LC layer 3 interposed between the pixel and common electrodes 190 and 270 functions as a dielectric of the LC capacitor $C_{LC}$. The pixel electrode 190 is electrically connected to the switching element Q, and the common electrode 270 is supplied with a common voltage $V_{com}$, and covers an entire surface of the upper panel 200. As an alternative to the exemplary embodiment of FIG. 3, the common electrode 270 may be provided on the lower panel 100. In such a case, at least one of the pixel electrode 190 and the common electrode 270 may be shaped as a bar or a stripe.

The storage capacitor $C_{ST}$ is an auxiliary capacitor for the LC capacitor $C_{LC}$. When the pixel electrode 190 and a separate signal line (not shown), which is provided on the lower panel 100, are overlapped with each other, with an insulator interposed between the pixel electrode 190 and the separate signal line, an overlap portion becomes the storage capacitor $C_{ST}$. The separate signal line is supplied with a predetermined voltage such as the common voltage $V_{com}$. Alternatively, the storage capacitor $C_{ST}$ may be formed by overlapping of the pixel electrode 190 and a previous gate line that is placed directly before the pixel electrode 190, interposing an insulator between the pixel electrode 190 and the previous gate line.

For a color display, each pixel uniquely exhibits one of three primary colors (i.e., spatial division), or sequentially exhibits the three primary colors in turn depending on time (i.e., temporal division), so that a spatial or temporal sum of the primary colors is recognized as a desired color. FIG. 3 shows an example of the spatial division where each pixel includes a color filter 230, for exhibiting one of the primary colors, disposed in an area of the upper panel 200 corresponding to the pixel electrode 190. As an alternative to the exemplary embodiment of FIG. 3, the color filter 230 may be disposed on or under the pixel electrode 190 of the lower panel 100.

Referring to FIG. 2, the backlight 340 is mounted proximate to the LC panel assembly 300. The backlight 340 comprises a two-dimensional light source unit 341 and optical sheets 343. The two dimensional light source unit 341 includes a plurality of LED chips (not shown) and an array of lens pattern members 344. The mold frame 364 receives the light source unit 341 and the optical sheets 343.

The LED chips may utilize only white LED chips emitting white light, or a mixing array of red, green, and blue LED chips. A mixing array of a white LED chip and a red LED chip may be also used. In such a case, the red LED chip functions as an auxiliary of the white LED chip.

In the exemplary embodiment shown in FIG. 2, the lens pattern members 344 include three array lines disposed parallel to each other along a longitudinal direction of the LCD device, but a number of array lines and an arrangement of the array lines can be controlled depending on a required brightness and size of the LCD device 10.

Polarizers 11 and 21 are provided on outer surfaces of the lower and upper panels 100 and 200 of the LC panel assembly 300 for polarizing light emitted by the two-dimensional light source unit 341.

Referring to FIG. 1 and FIG. 2, the gray voltage generator 800 is included in the data PCB 550 and generates a first set and a second set of gray voltages related to a transmittance of the pixels. The gray voltages in the first set have a positive polarity with respect to the common voltage $v_{com}$, while the gray voltages of the second set have negative polarity with respect to the common voltage $v_{com}$.

The gate drivers 400 are individually mounted on each gate TCP 410, having a shape of an integrated circuit (IC) chip, and are individually connected to the gate lines $G_1$-$G_n$ of the LC panel assembly 300 for transmitting the gate signals, consisting of combinations of gate-on voltages $V_{on}$ and gate-off voltages $V_{off}$ input from an external device, to the gate lines $G_1$-$G_n$.

The data drivers 500 are individually mounted on each data TCP 510, having shapes of IC chips, and are individually connected to the data lines $D_1$-$D_m$ of the LC panel assembly 300 for transmitting data voltages, which are selected from the gray voltages supplied by the gray voltage generator 800, to the data lines $D_1$-$D_m$.

In another exemplary embodiment of the present invention, the gate driver 400 or the data driver 500 is directly mounted on the lower panel 100, having the shape of an IC chip, and in still another exemplary embodiment of the present invention, the gate driver 400 or the data driver 500 is integrated into the lower panel 100 along with other elements. In the above cases, the gate PCB 450 and the gate TCP 410 or the data PCB 550 and the data TCP 510 can be omitted.

The signal controller 600 is included in the data PCB 550 or the gate PCB 450 for controlling operation of the gate driver 400 and the data driver 500.

Hereinafter, operation of the above-mentioned LCD device will be described in detail.

The signal controller 600 receives input image signals R, G, and B and input control signals for controlling a display of the LC panel assembly 300. The input control signals include, for example, a vertical synchronizing signal $V_{sync}$, a horizontal synchronizing signal $H_{sync}$, a main clock MCLK, a data enable signal DE, etc., from an external graphic controller (not shown). In response to the input image signals R, G, and B and the input control signals, the signal controller 600 processes the input image signals R, G, and B suitably for operation of the LC panel assembly 300 and generates gate control signals CONT1 and data control signals CONT2, and then outputs the gate control signals CONT1 and the data control signals CONT2 to the gate driver 400 and the data driver 500, respectively.

The gate control signals CONT1 include a vertical synchronizing start signal STV for informing the gate driver 400 of a beginning of a frame, a gate clock signal CPV for controlling an output time of the gate-on voltages $V_{on}$, and an output enable signal OE for defining a duration of the gate-on voltages $V_{on}$.

The data control signals CONT2 include a horizontal synchronizing start signal STH for informing the data driver 500 of a beginning of data transmission, a load signal LOAD for instructing the data driver 500 to apply the data voltages to the data lines $D_1$-$D_m$, a reverse signal RVS for reversing a polarity of the data voltages with respect to the common voltage $V_{com}$, and a data clock signal HCLK.

Responsive to the data control signals CONT2 from the signal controller 600, the data driver 500 successively receives image data DAT for a row of the pixels from the signal controller 600, shifts them, converts the image data DAT into analog data voltages selected from the gray voltages from the gray voltage generator 800, and then applies the data voltages to data lines $D_1$-$D_m$.

The gate driver 400 applies the gate-on voltages $V_{on}$ to the gate lines $G_1$-$G_n$ in response to the gate control signals CONT1 from the signal controller 600, thereby turning on the switching elements Q connected thereto. The data voltages applied to the data lines $G_1$-$G_n$ are applied to corresponding pixels through turned-on switching elements Q.

A difference between the data voltage applied to the pixel and the common voltage $V_{com}$ is represented as a voltage across the LC capacitor $C_{LC}$, namely, a pixel voltage. LC molecules in the LC capacitor $C_{LC}$ have orientations depending on a magnitude of the pixel voltage.

The light source driver 920 controls current applied to the light source section 910 for switching LEDs of the light source section 910, and also controls brightness of light from the LEDs.

When light emitted by the LEDs passes through the LC layer 3, polarization of the light is varied according to the orientations of the LC molecules. The polarizer converts a difference of light polarization into a difference of light transmittance.

By repeating this procedure by a unit of a horizontal period (which is denoted by "1H" and equal to one period of the horizontal synchronizing signal $H_{sync}$, the data enable signal DE, and the gate clock CPV), all gate lines $G_1$-$G_n$ are sequentially supplied with the gate-on voltages $V_{on}$ during a frame, thereby applying the data voltages to all pixels. When a next frame starts after finishing one frame, the reverse control signal RVS applied to the data driver 500 is controlled such that the polarity of the data voltages is reversed with respect to that of the previous frame (which is referred to as "frame inversion"). The reverse control signal RVS may also be controlled such that the polarity of the data voltages flowing along a data line in one frame are reversed (for example, line inversion and dot inversion), or the polarity of the data voltages in one packet are reversed (for example, column inversion and dot inversion).

Hereinafter, the light source section 910, namely, the two-dimensional light source unit 341 for the backlight 340 according to an exemplary embodiment of the present invention will be described in detail with reference to FIG. 4.

Figure 4:
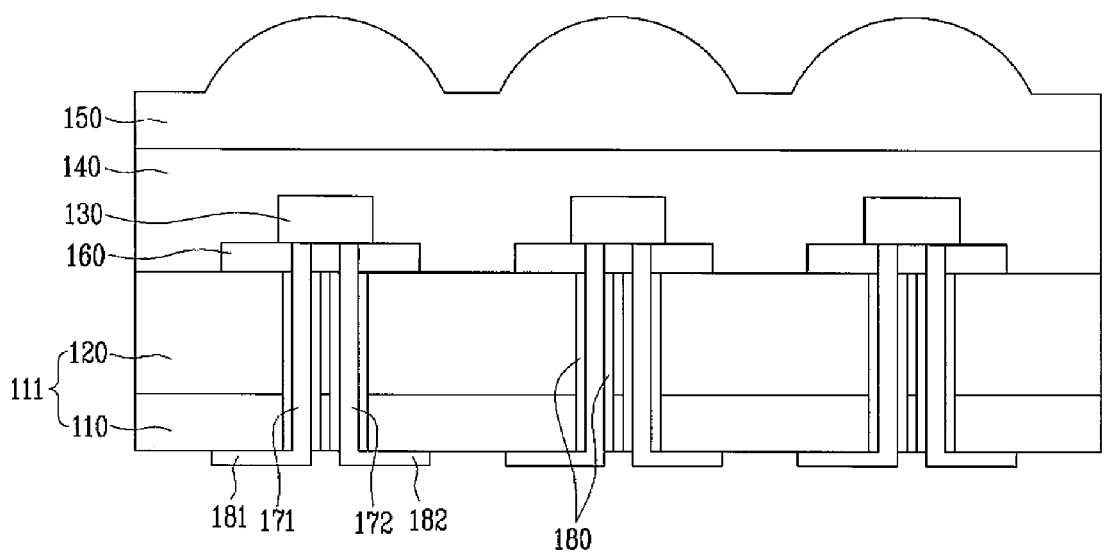
FIG. 4 is a cross-sectional view of a two-dimensional light source using LEDs according to an exemplary embodiment of the present invention.

FIG. 4 is a cross-sectional view of a two-dimensional light source using LEDs according to an exemplary embodiment of the present invention.

The two-dimensional light source of this embodiment comprises: a base substrate 111 having a double-substrate structure including a PCB substrate 110 and a heat radiating substrate 120; a chip base 160 disposed on the base substrate 111; an LED chip 130 disposed on the chip base 160; a buffer layer 140 that covers the LED chip 130 and includes a flat upper surface; and an optical layer 150 disposed on the buffer layer 140.

A lower surface of the PCB substrate 110, which is placed at a lower part of the base substrate 111, is provided with a wire member including wires 181 and 182 for driving the two-dimensional light source and for supplying power to the LED chips 130.

The heat radiating substrate 120 is disposed at an upper part of the base substrate 111 and is formed with a metallic material having prominent thermal conductivity such as aluminum (Al) or the like, but any different material having prominent thermal conductivity may be used as an alternative to the metallic material. A lower surface of the heat radiating substrate 120 is attached to an upper surface of the PCB substrate 110.

The base substrate 111 is provided with holes passing from the lower surface of the PCB substrate 110 to an upper surface of the heat radiating substrate 120, where a plug member including plugs 171 and 172 is formed for electrically connecting an electrode member of the LED chip 130 to the wires 181 and 182. The electrode member includes, for example, a first electrode and a second electrode which may correspond to a positive electrode and a negative electrode, respectively. Additionally, coating films 180 are individually disposed on inner surfaces of the holes to insulate the plugs 171 and 172 from the heat radiating substrate 120. There is no need to form the coating films 180 on an entire inner surface of the holes, thus, for example, the coating films 180 may be formed on at least an inner surface of the holes passing through the heat radiating substrate 120. However, the coating films 180 may be omitted if the heating radiating substrate 120 is formed of an insulating material.

The chip base 160, made of an insulating material, functions as an insulating layer between the LED chip 130 and the heat radiating substrate 120. The holes extend from the PCB substrate 110 to a top of the chip base 160, where the plugs 171 and 172 are filled.

Positive and negative electrodes of the LED chip 130 mounted on the chip base 160 are electrically connected to the plugs 171 and 172 by a flip chip bonding or a wire bonding, etc., which will be described below.

The buffer layer 140, made of transparent resin, etc., covers the LED chip 130 for protection, and a top surface thereof is planarized for facilitating attachment of the optical layer 150, or other films. The optical layer 150 may be produced separately and has a film shape.

The optical layer 150 is a lens-array film having a predetermined shape that uniformly disperses light emitted by the LED chip 130 to a wider area. The optical layer 150 includes an embossed pattern of lenses and each lens is a pattern member. Each lens is disposed at a portion of the optical layer 150 corresponding to a position of an LED chip 130. Additionally, the lens may be constructed so that an acute angle formed between a straight line linking a center of a surface of the LED chip 130 to a point on a surface of the lens and a main axis of the lens is always larger than an acute angle formed between a normal for a corresponding point on a surface of the lens and the main axis of the lens. If the lens satisfies such a condition, light emitted by the LEDs can be uniformly dispersed to a wider area by passing through the optical layer 150.

For the optical layer 150, various optical layers (or films), such as a thin-film optical layer including a digital optics system, a holographic grating layer, etc., as well as the above-mentioned lens-array film can be used.

As the above, in this exemplary embodiment of the present invention, the LED chip 130 is a bare chip mounted on the base substrate 111 and then the optical layer 150 is integrally formed thereon. Accordingly, the two-dimensional light source becomes slim and a fabrication process of the backlight is simplified.

Figure 5:
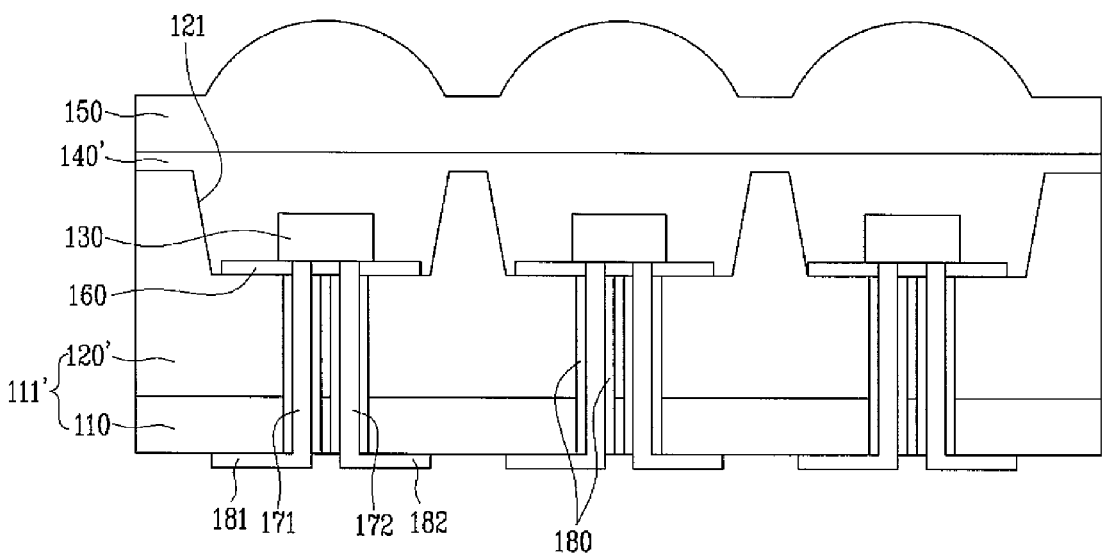
FIG. 5 is a cross-sectional view of a two-dimensional light source using LEDs according to another exemplary embodiment of the present invention.

FIG. 5 is a cross-sectional view of a two-dimensional light source using LEDs according to another exemplary embodiment of the present invention.

Like the exemplary embodiment shown in FIG. 4, the two-dimensional light source of this exemplary embodiment comprises: the base substrate 111' of a double-substrate structure including the PCB substrate 110 and a heat radiating substrate 120'; the chip base 160 disposed on the base substrate 111'; the LED chip 130 disposed on the chip base 160; a buffer layer 140' that covers the LED chip 130 and has a flat upper surface; and the optical layer 150 disposed on the buffer layer 140'.

In this exemplary embodiment, grooves 121 are formed at an upper surface of the heat radiating substrate 120, and the chip base 160 and the LED chip 130 are disposed on a bottom portion of the groove 121. Such a structure makes the two-dimensional light source slimmer.

Figure 6:
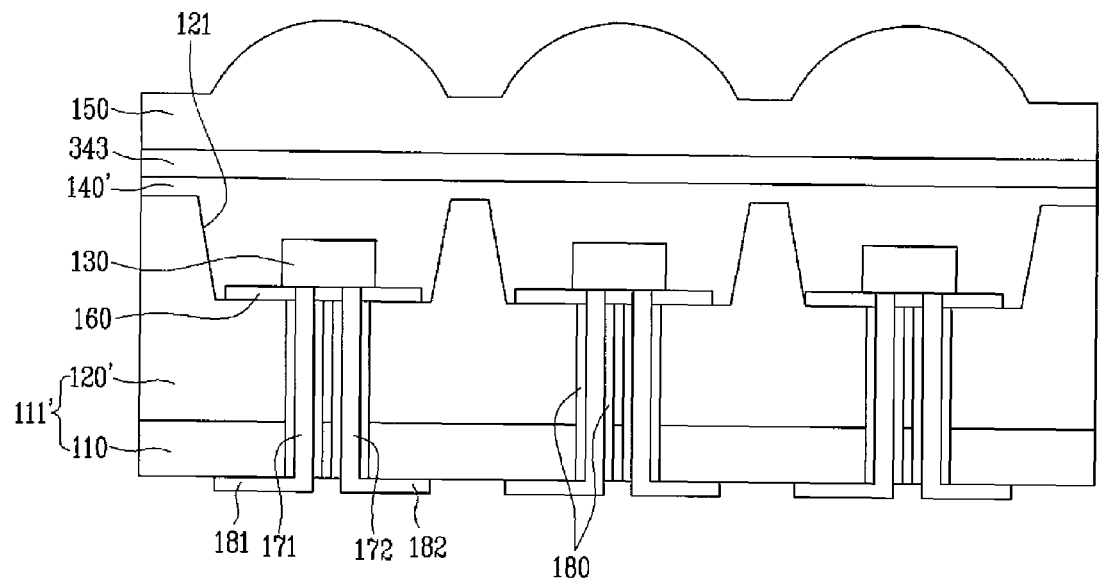
FIG. 6 is a cross-sectional view of a two-dimensional light source using LEDs according to an additional exemplary embodiment of the present invention.

FIG. 6 is a cross-sectional view of a two-dimensional light source using LEDs according to an additional exemplary embodiment of the present invention.

The exemplary embodiment shown in FIG. 6 is substantially same as the exemplary embodiment shown in FIG. 5 except that a diffusing layer 343 is further provided between the buffer layer 140' and the optical layer 150.

The diffusing layer 343 disperses light emitted by the LED chip 130, so that uniformity of surface light emitted by the two-dimensional light source is improved. Alternatively, any different optical film may be used in addition to, or instead of, the diffusing layer 343.

Figure 7:
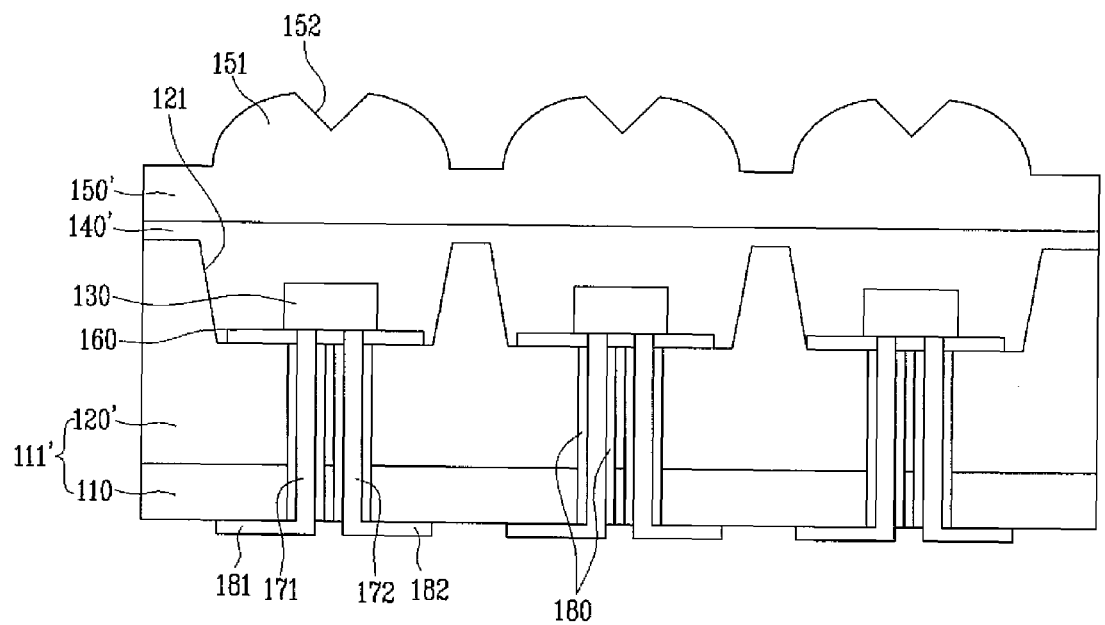
FIG. 7 is a cross-sectional view of a two-dimensional light source using LEDs according to yet another exemplary embodiment of the present invention.

FIG. 7 is a cross-sectional view of a two-dimensional light source using LEDs according to yet another exemplary embodiment of the present invention. The exemplary embodiment shown in FIG. 7 is substantially same as the exemplary embodiment shown in FIG. 6 except for an optical layer 150'. Thus, a detailed explanation of like elements will be omitted.

In FIG. 7, there is shown a variation example of lenses employed in the optical layer 150'. An outer surface of each of the lenses is divided into a curved centermost surface 152, whose center portion includes a cone-shaped groove, and a curved center-edge surface 151, which upwardly protrudes, i.e., is convex. For example, the curved center-edge surface 151 of each lens may form symmetry with respect to a main axis of the lens, which vertically extends from a center of the LED chip 130. The lens may be constructed so that an acute angle formed between a straight line linking the center of the surface of the LED chip 130 to a point of the curved center-edge surface 151 of the lens and the main axis of the lens is always larger than an acute angle formed between a normal for a corresponding point of the curved center-edge surface 151 of the lens and the main axis of the lens. The curved centermost surface 152 of the lens may also be symmetrical with respect to the main axis of the lens, which vertically extends from the center of the LED chip 130. Additionally, the curved centermost surface 152 is formed to satisfy the following equation.

$$A1+A2<90+\sin^{-1}(1/n)$$

where, n is a refraction index, A1 is an obtuse angle formed between the main axis of the lens and a tangent line of a point of the curved centermost surface 152, and A2 is an acute angle formed between a line linking the center of the LED chip 130 to the corresponding point on the curved centermost surface 152 and the main axis of the lens.

When the curved center-edge surface 151 and the curved centermost surface 152 of the lens satisfy the above equation, light emitted by the LED chip 130 can be dispersed uniformly to a wider area by passing through the optical layer 150.

Figure 8:
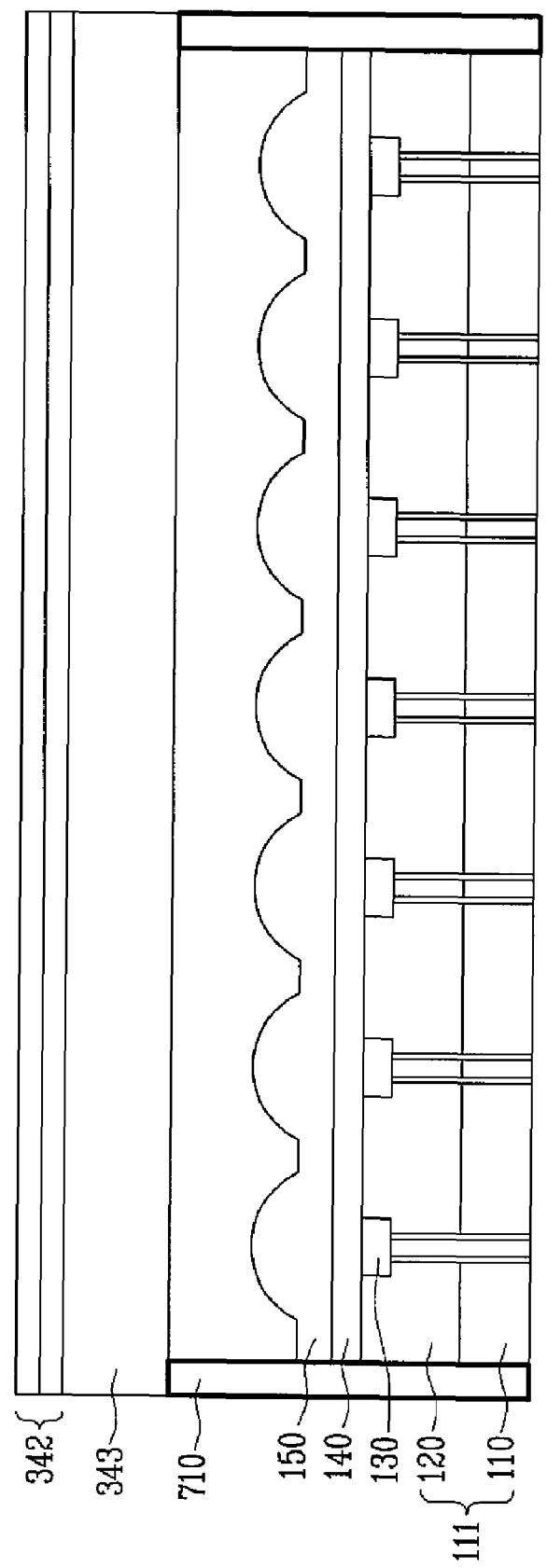
FIG. 8 is a cross-sectional view of a two-dimensional light source using LEDs according to still another exemplary embodiment of the present invention.

FIG. 8 is a cross-sectional view of a two-dimensional light source using the LEDs according to still another exemplary embodiment of the present invention.

As compared to the embodiments shown in FIG. 4 to FIG. 7, this exemplary embodiment further includes a support frame 710 disposed at a side of a two-dimensional light source that may be one of those shown in FIG. 4 to FIG. 7. The support frame 710 forms a predetermined space on the optical layer 150. The diffusing layer 343 and the optical films 342 are provided on the support frame 710, above the space on the optical layer 150. In such a configuration, the diffusing layer 343 serves as a support plate for the optical films 342 and also disperses light like the optical films 342. For the optical films 342 provided on the diffusing layer 343, a double brightness enhanced film (DBEF), a brightness enhanced film (BEF), etc., may be used.

Figure 9:
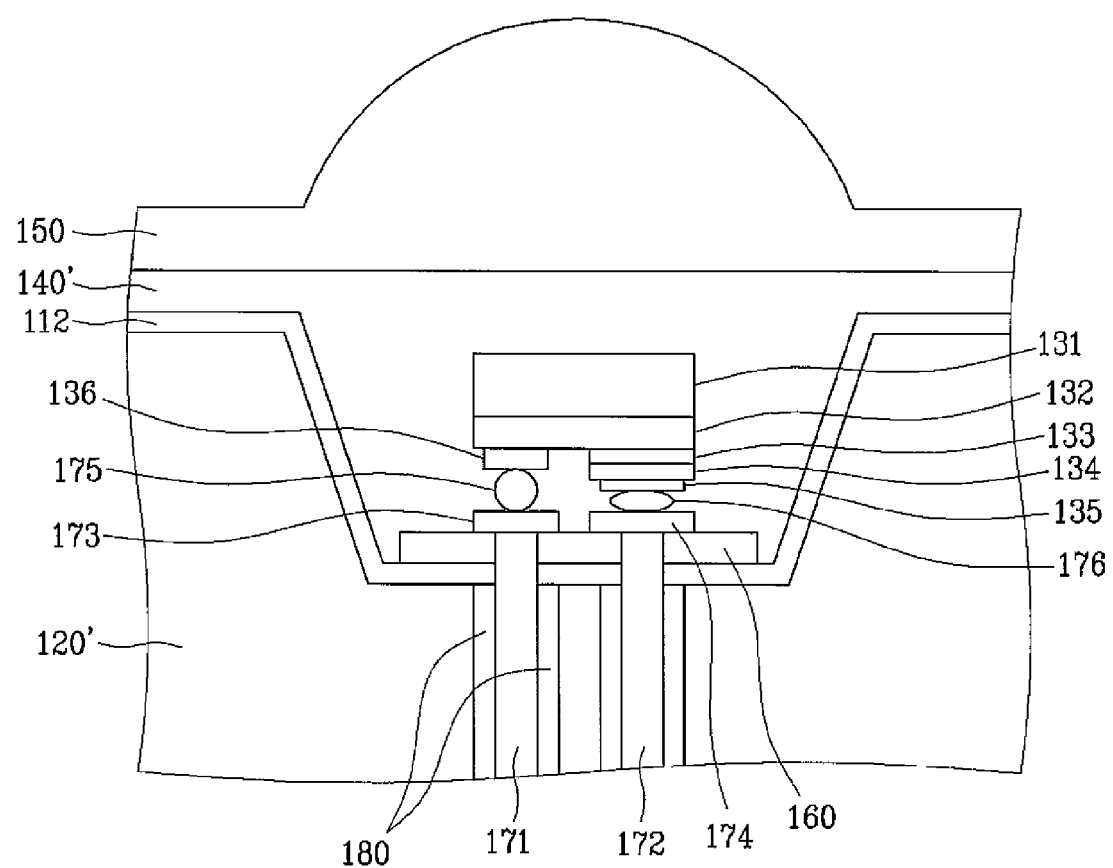
FIG. 9 to FIG. 11 are cross-sectional views of various LEDs used for a two-dimensional light source according to exemplary embodiments of the present invention.
Figure 10:
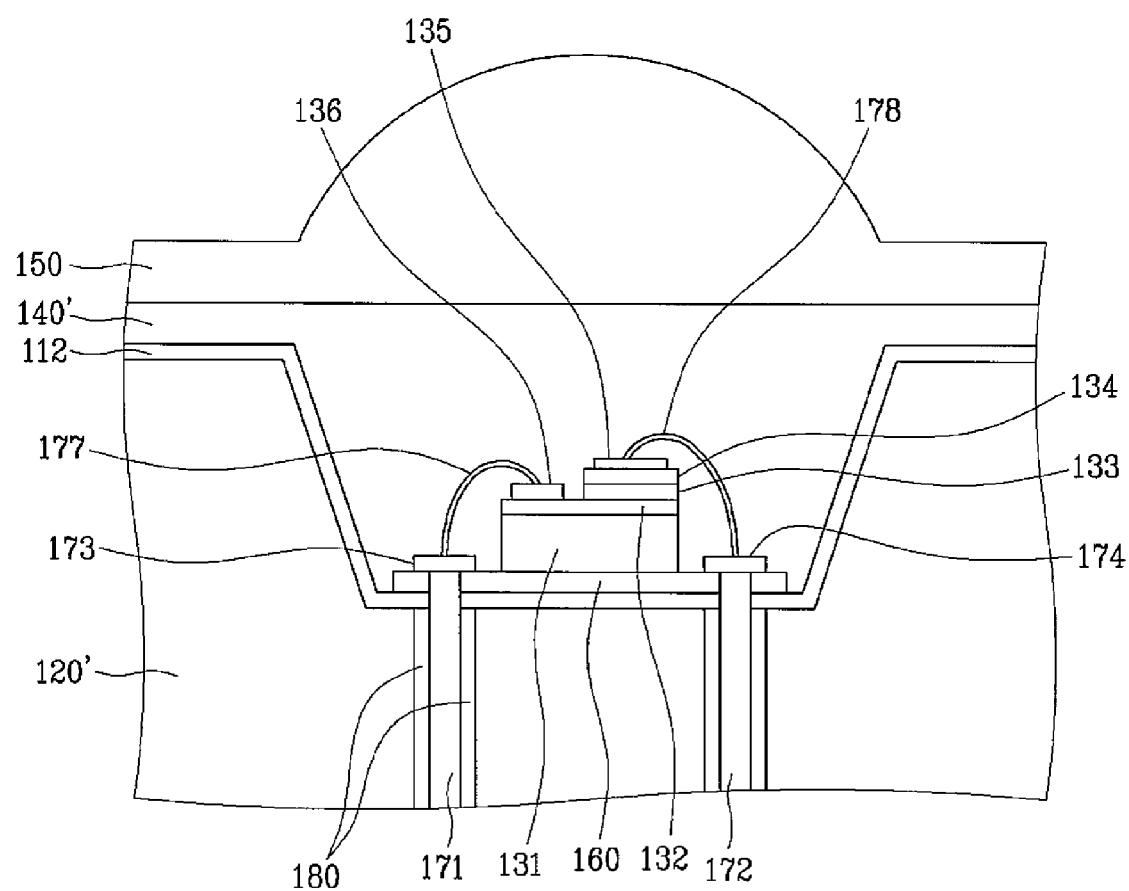
Figure 11:
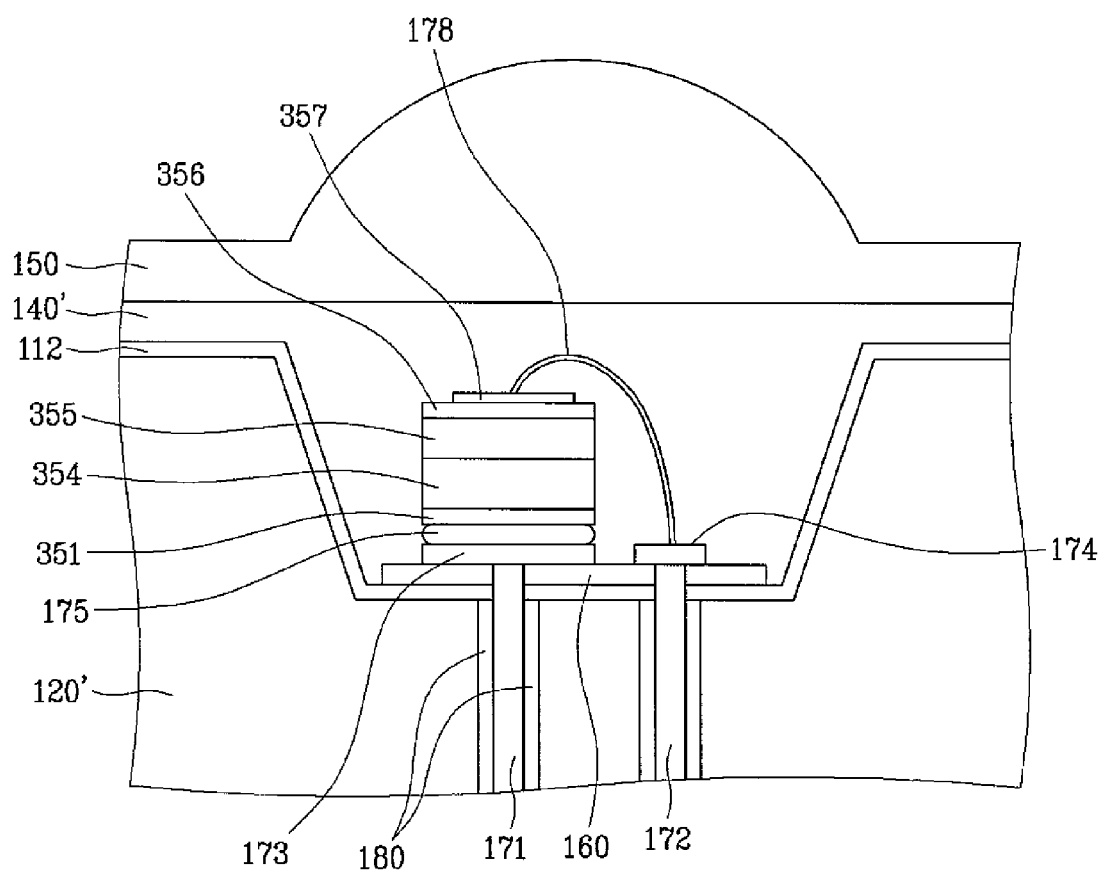

FIG. 9 to FIG. 11 are cross-sectional views of various LEDs used for the two-dimensional light source according to exemplary embodiments of the present invention.

First, referring to FIG. 9, the heat radiating layer 120' is coated with a reflection layer 112, and the chip base 160 is disposed on the reflection layer 112 disposed on an inner surface of a groove of the heat radiating layer 120'. Plug heads 173 and 174, passing through holes, reach above the chip base 160 and are bonded to the LED chip by the flip chip bonding method.

In this embodiment, the LED chip includes an insulating substrate 131, an N-type semiconductor layer 132, an activating layer 133, a P-type semiconductor layer 134, and two electrodes 135 and 136 individually disposed on the P-type semiconductor layer 132 and the N-type semiconductor layer 134, respectively. The two electrodes 135 and 136 are connected to the plug heads 173 and 174 through conductive bumpers 175 and 176. A technique for directly connecting the two electrodes 135 and 136 and the plug heads 173 and 174 through the conductive bumpers 175 and 176 after flipping over the LED chip, as mentioned above, is the flip chip bonding method previously cited.

Next, referring to FIG. 10, the heat radiating layer 120' is coated with the reflection layer 112, and the chip base 160 is provided on the reflection layer 112 disposed on the inner surface of the groove of the heat radiating layer 120'. Plug heads 173 and 174, passing through holes, reach above the chip base 160 and are bonded to the LED chip by the wire bonding method.

In this embodiment, the LED chip includes the insulating substrate 131, the N-type semiconductor layer 132, the activating layer 133, the P-type semiconductor layer 134, and the two electrodes 135 and 136 individually disposed on the P-type semiconductor layer 132 and the N-type semiconductor layer 134, respectively. The two electrodes 135 and 136 are connected to the plug heads 173 and 174 through wires 177 and 178. A technique for contacting the insulating substrate 131 with the chip base 160 and for connecting the two electrodes 135 and 136 to the plug heads 173 and 174 through the wires 177 and 178 is the wire bonding technique previously cited.

Next, referring to FIG. 11, the heat radiating layer 120' is coated with the reflection layer 112, and the chip base 160 is provided on the reflection layer 112 disposed on the inner surface of the groove of the heat radiating layer 120'. The plug heads 173 and 174 reach up to the top of the chip base 160 passing through holes. A first electrode 351 of the LED chip is directly connected to the plug head 173 through a conductive bumper 175 and a second electrode 357 is bonded to the plug head 174 through a wire 178.

In this embodiment, the LED chip includes the first electrode 351, a conductive substrate 354, an N-type semiconductor 355, an activating layer 356, and the second electrode 357 successively disposed. The first electrode 351 is connected to the plug head 173 through the conductive bumper 175, while the second electrode 357 is connected to the plug head 174 through the wire 178.

Figure 12:
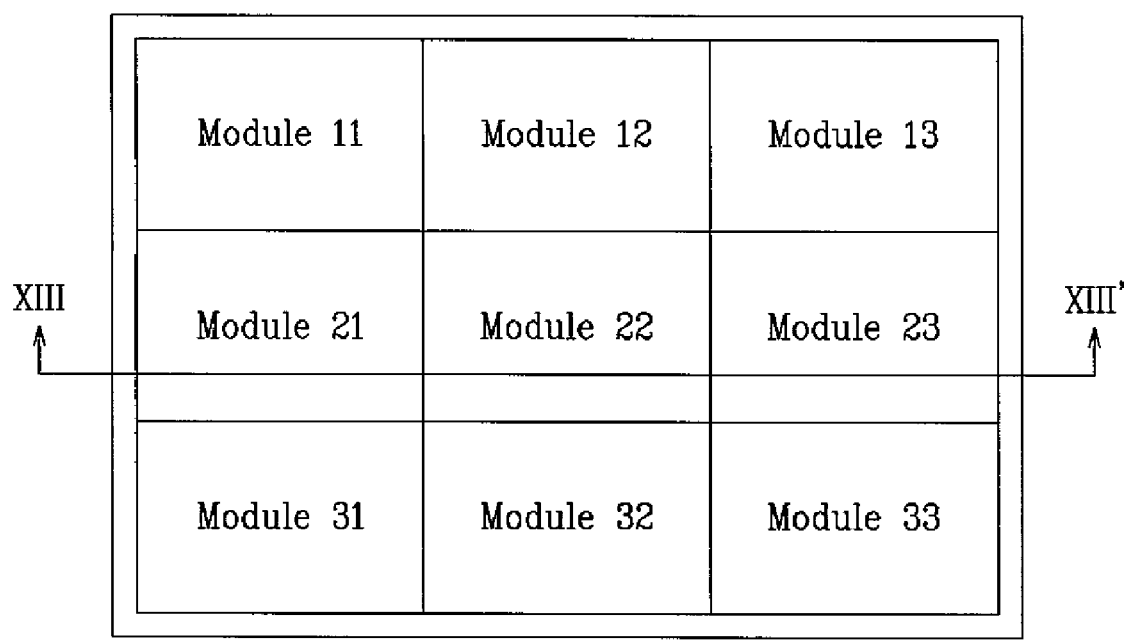
FIG. 12 is a plan view of a two-dimensional light source using LEDs according to another exemplary embodiment of the present invention.
Figure 13:
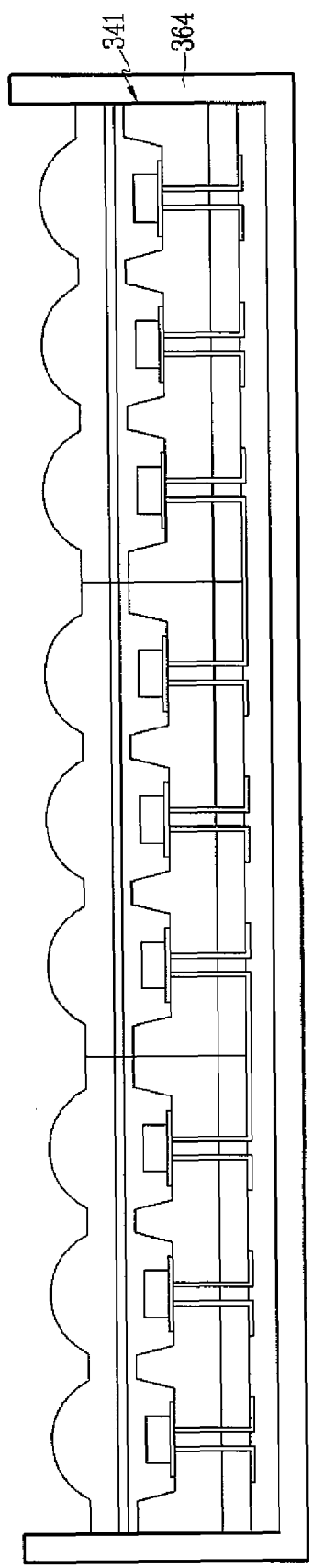
FIG. 13 is a cross-sectional view taken along line XIII-XIII' of FIG. 12.

FIG. 12 is a plan view of a two-dimensional light source using LEDs according to another embodiment of the present invention and FIG. 13 is a cross-sectional view taken along XIII-XIII' of FIG. 12.

In FIG. 12 and FIG. 13, there is shown a modular light source in which modules are arrayed substantially in a matrix. A light source used in this embodiment may be any of the two-dimensional light sources shown in FIG. 4 to FIG. 11. The modular light source is more profitable for fabricating large-size LC panels.

To reinforce combination between the two-dimensional light source modules 341, the light source modules 341 are disposed in a frame 364. The frame 364 surrounds and supports the light source modules 341. Alternatively, the frame 364 may be omitted if the modular light source includes any combination element therein. As shown in FIG. 12, the light source modules 341 are disposed substantially in a matrix. For example, module 11 is disposed in a first row and a first column, module 21 is disposed in a second row and the first column, module 12 is disposed in the first row and a second column, etc.

A PCB substrate of the light source modules 341 is provided with wires for making a connection between the light source modules 341.

In the present invention, the LED chip 130 is a bare chip mounted on the base substrate 111 and then the optical layer 150 is integrally formed thereon. Accordingly, the two-dimensional light source becomes slim and a fabrication process of the back light 340 is simplified.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A light source comprising:
 a base substrate having a lower surface, an upper surface and a hole, the hole penetrating the base substrate;
 a wire member disposed on the lower surface of the base substrate;
 a light emitting diode (LED) chip disposed on the upper surface of the base substrate, the LED chip having an electrode member;
 a plug member disposed in the hole and connecting the electrode member to the wire member through the hole;
 a buffer layer covering the LED chip; and
 an optical layer disposed on the buffer layer, the optical layer includes a pattern member disposed at a portion of the optical layer corresponding to the LED chip,
 wherein the base substrate includes a printed circuit board (PCB) substrate and a heat radiating substrate disposed on the PCB substrate, the wire member is disposed on the PCB substrate, and the LED chip is disposed on the heat radiating substrate.

2. The light source of claim 1, wherein the heat radiating substrate is formed with a metallic material.

3. The light source of claim 2, further comprising a chip base provided on the heat radiating substrate that insulates between the electrode member of the LED chip and the heat radiating substrate.

4. The light source of claim 3, wherein the chip base has a hole and the plug member is connected to the electrode member of the LED chip through the hole of the chip base.

5. The light source of claim 2, further comprising a coating film which is disposed on at least an inner surface of the hole of the heat radiating substrate and insulates between the plug member and the heat radiating substrate.

6. The light source of claim 1, wherein the pattern member comprises an embossed lens.

7. The light source of claim 6, wherein the embossed lens is a convex lens.

8. The light source of claim 1, wherein the LED chip is bonded to the plug member by a flip chip bonding.

9. The light source of claim 1, wherein the buffer layer has a planarized upper surface.

* * * * *